United States Patent
Yonemura et al.

(10) Patent No.: US 9,735,335 B2
(45) Date of Patent: Aug. 15, 2017

(54) THERMOELECTRIC CONVERSION ELEMENT AND PYROELECTRIC SENSOR

(71) Applicant: Seiko Epson Corporation, Tokyo (JP)

(72) Inventors: Takayuki Yonemura, Suwa (JP); Toshiki Hara, Suwa (JP)

(73) Assignee: Seiko Epson Corporation (JP)

( * ) Notice: Subject to any disclaimer, the term of this patent is extended or adjusted under 35 U.S.C. 154(b) by 1 day.

(21) Appl. No.: 15/153,007

(22) Filed: May 12, 2016

(65) Prior Publication Data
US 2016/0351778 A1 Dec. 1, 2016

(30) Foreign Application Priority Data

May 28, 2015 (JP) ................................. 2015-109077

(51) Int. Cl.
- H01L 31/058 (2006.01)
- H01L 37/02 (2006.01)
- G01J 5/12 (2006.01)
- G01J 5/34 (2006.01)

(52) U.S. Cl.
CPC .............. *H01L 37/025* (2013.01); *G01J 5/12* (2013.01); *G01J 5/34* (2013.01)

(58) Field of Classification Search
CPC .................................................. H01L 37/025
USPC ........................................................ 257/467
See application file for complete search history.

(56) References Cited

U.S. PATENT DOCUMENTS

| | | | |
|---|---|---|---|
| 5,949,071 A | 9/1999 | Ruffner et al. | |
| 6,387,012 B1* | 5/2002 | Mitamura | B60W 10/06 477/110 |
| 7,026,218 B2* | 4/2006 | Rotondaro | H01L 21/28035 257/E21.197 |
| 2002/0083863 A1* | 7/2002 | Mitamura | C04B 35/2658 106/1.05 |
| 2004/0090806 A1* | 5/2004 | Yoshida | H02M 3/156 363/60 |
| 2006/0088660 A1* | 4/2006 | Putkonen | C23C 16/409 427/248.1 |
| 2010/0071179 A1* | 3/2010 | Koizumi | C01G 23/003 29/25.35 |

FOREIGN PATENT DOCUMENTS

JP 2003-530538 A 10/2003

OTHER PUBLICATIONS

Hiroshi Maiwa, "Pyroelectric and Electrocaloric Properties of BaTiO$_3$-Based and PLZT Ceramics and PMN-PT Crystals", Shonan Institute of Technology, pp. 157-158 with English translation, Apr. 12, 2007.

* cited by examiner

*Primary Examiner* — Jami M Valentine
(74) *Attorney, Agent, or Firm* — Harness, Dickey & Pierce, P.L.C.

(57) ABSTRACT

A thermoelectric conversion element includes a first electrode on provided a substrate; a pyroelectric film that is provided on the first electrode, is formed of a composite oxide having an ABO$_3$-type perovskite structure, and generates a surface charge due to temperature change; and a second electrode provided on the pyroelectric film, in which the composite oxide which forms at least a portion of layer in the pyroelectric film contains at least Pb, Nb, and Ti, and is formed of tetragonal crystal which is oriented in the direction of {100} on the substrate.

16 Claims, 11 Drawing Sheets

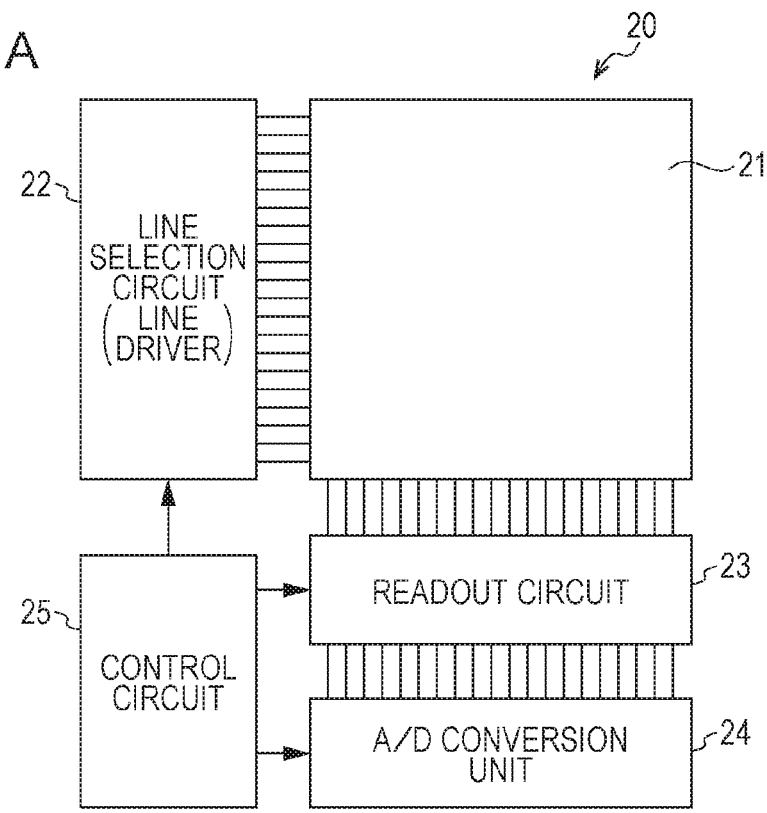
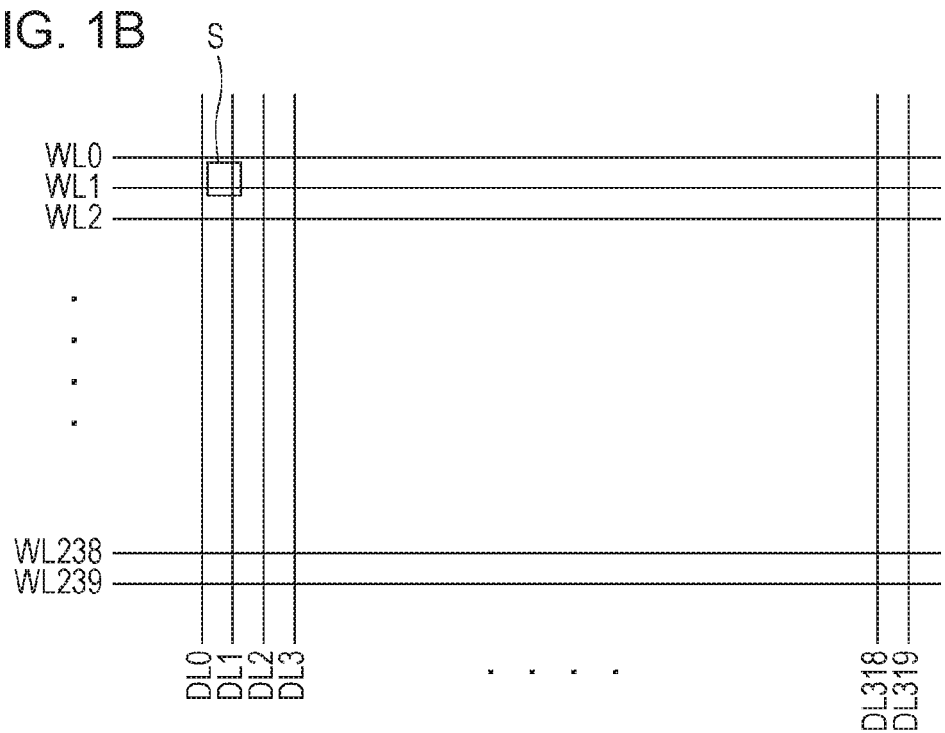

THERMOELECTRIC CONVERSION ELEMENT AND PYROELECTRIC SENSOR

BACKGROUND

1. Technical Field

The present invention relates to a thermoelectric conversion element and a pyroelectric sensor.

2. Related Art

The pyroelectric sensor is roughly divided into a quantum-type sensor and a thermal-type sensor based on detection principles thereof. The thermal-type sensor has attracted attention from the aspect that a cooling step for the noise countermeasure is not necessary. For example, the pyroelectric sensor (a pyroelectric infrared sensor) which is one of the thermal-type sensors has been widely used in a motion sensor or the like, and can obtain information of the existence or temperature of a human body in a contactless manner by detecting infrared radiation in the vicinity of a wavelength of 10 μm which is radiated from the human body. Such a pyroelectric sensor is provided with a thermoelectric conversion element.

The thermoelectric conversion element has properties (pyroelectric effect) which cause temperature change by absorbing infrared thermal energy such that an electrical charge is generated in response to the temperature change. As a material (a pyroelectric material) which forms the thermoelectric conversion element, a material having spontaneous polarization is frequently used. For example, lead zirconate titanate (PZT) can be exemplified as a representative material. It is well-known that it is possible to obtain a relatively large pyroelectric coefficient by using the PZT. A pyroelectric effect is a phenomenon which occurs due to the temperature change of the spontaneous polarization. For this reason, in a case where the material having the spontaneous polarization is used as the pyroelectric material, it is necessary to induce the spontaneous polarization by applying a voltage. In this case, a domain is generated in the material so as to relieve internal stress due to the spontaneous polarization.

For example, a pyroelectric sensor in which PZT formed by using a spin coating method is used as a pyroelectric material has been suggested (refer to JP-T-2003-530538). The PZT basically has a rhombohedral structure, and domains of 71° and 109°.

On the other hand, in a case of using a pyroelectric material having a tetragonal structure, the pyroelectric material has a domain of 90°.

However, in recent years, higher performance of the pyroelectric sensor has been required, and thus more improved sensitivity has been desired, which is a problem to be solved. The problem also exists in a thermoelectric conversion element which is built into a device other than the pyroelectric sensor.

SUMMARY

An advantage of some aspects of the invention is to provide a thermoelectric conversion element and a pyroelectric sensor which are capable of realizing the improvement of the sensitivity.

According to an aspect of the invention, there is provided a thermoelectric conversion element including a first electrode provided on a substrate; a pyroelectric film that is provided on the first electrode, is formed of a composite oxide having an $ABO_3$-type perovskite structure, and generates a surface charge due to temperature change; and a second electrode provided on the pyroelectric film, in which the composite oxide which forms at least a portion of a layer in the pyroelectric film contains at least Pb, Nb, and Ti, and is formed of tetragonal crystal which is oriented in the direction of {100} on the substrate.

The composite oxide which contains at least Pb, Nb, and Ti, and is formed of tetragonal crystal which is oriented in the direction of {100} on the substrate, and has an $ABO_3$-type perovskite structure forms a nano-domain. The ferroelectric material which forms a nano-sized domain has excellent properties (ferroelectricity, piezoelectricity, pyroelectricity, and the like). By employing the pyroelectric material which forms the aforementioned nano-domain, it is possible to improve the pyroelectric coefficient of the pyroelectric film, and thus the sensitivity of the thermoelectric conversion element.

Here, it is preferable that the composite oxide which forms at least a portion of layer in the pyroelectric film has a composition expressed by the following Formula (1).

$$x Pb(Mg,Nb)O_3\text{-}(1-x)PbTiO_3 \quad (1)$$

$(0.20 \leq x \leq 0.60)$

According to the above description, the pyroelectric coefficient of the pyroelectric film is further improved by forming a nano-domain, and thus the sensitivity of the thermoelectric conversion element can be further improved. In addition, the composite oxide having the composition expressed by Formula (1) has a relative permittivity lower than that of lead zirconate titanate (PZT) which is generally used as the pyroelectric material, and thus, it is possible to decrease electrostatic capacitance C of an element. With this, a generation voltage $\Delta V$ relating to a relational equation expressed by $\Delta V = \Delta Q / C$ is increased. Therefore, in comparison with the case of using the PZT, it is possible to further improve the sensitivity of the thermoelectric conversion element.

In addition, it is preferable that in the crystal, a crystallite diameter $D_{(002)}$ of a c-axis component which contributes to a pyroelectric effect is equal to or less than 20 nm, and is preferably equal to or less than 15 nm. The effect of the improvement of the pyroelectric coefficient by forming the nano-domain is equal to or less than 20 nm, which is remarkable. Accordingly, it is possible to further improve the sensitivity of the thermoelectric conversion element by setting the crystallite diameter $D_{(002)}$ (size of C domain) of the c-axis component which contributes to the pyroelectric effect to be the above described size.

Further, it is preferable that a ratio $(D_{(200)}/D_{(002)})$ of a crystallite diameter $D_{(200)}$ to the crystallite diameter $D_{(002)}$ in the crystal is greater than 3. With this, as the crystallite diameter $D_{(002)}$ of the c-axis component which contributes to the pyroelectric effect is smaller than the crystallite diameter $D_{(200)}$ of an a-axis and a b-axis component which do not contribute to the pyroelectric effect, it is possible to improve the pyroelectric coefficient. Accordingly, it is possible to further improve the sensitivity of the thermoelectric conversion element.

In addition, it is preferable that the relative permittivity of a part which is formed of the composite oxide forming at least a portion of layer in the pyroelectric film is in a range of equal to or greater than 600 and less than 1400. This value is lower than that of the relative permittivity (1600) of the PZT which is generally used in pyroelectrics. Accordingly, in comparison with the case of using the PZT, it is possible to reliably improve the sensitivity of the thermoelectric conversion element.

Further, it is preferable that the pyroelectric film includes a main layer which is formed of the composite oxide forming at least a portion of layer in the pyroelectric film, and a base layer which is formed on the first electrode side of the main layer, in which the lattice matching ratio of the base layer to the c-axis of the composite oxide forming the main layer is less than 1%, and the lattice matching ratio of the base layer to the a-axis and the b-axis of the composite oxide forming the main layer is equal to or greater than 1%. With this, it becomes easier to control the orientation of the pyroelectric material which corresponds to the main layer, and it is possible to stabilize the c-axis component of the pyroelectric material which is the tetragonal crystal. Accordingly, it is possible to further improve the sensitivity of the thermoelectric conversion element.

In addition, it is preferable that the relative permittivity of the main layer is smaller than the relative permittivity of the base layer. With this, it is possible to suppress the electrostatic capacitance of the element, and thus it is possible to improve the sensitivity of the thermoelectric conversion element.

Further, it is preferable that the base layer is the PZT. With this, it becomes easier to control the orientation of the pyroelectric material which corresponds to the main layer. Accordingly, it is possible to further improve the sensitivity of the thermoelectric conversion element.

According to another aspect of the invention, there is provided a pyroelectric sensor including the thermoelectric conversion element according to any one of the above descriptions. According to the aspect, the pyroelectric sensor is capable of realizing the improvement of the sensitivity with the thermoelectric conversion element provided.

Here, it is preferable that the thermoelectric conversion element is connected to a transistor, and thus the transistor outputs a detecting signal based on a surface charge generated in the thermoelectric conversion element. With this, it is possible to detect the temperature change of the thermoelectric conversion element via the transistor.

Further, it is preferable that the transistor is a field effect transistor, and at least one of the first electrode and the second electrode is connected to a gate of the field effect transistor. With this, it is possible to easily form a circuit which outputs the surface charge generated in the thermoelectric conversion element as the detecting signal.

BRIEF DESCRIPTION OF THE DRAWINGS

The invention will be described with reference to the accompanying drawings, wherein like numbers reference like elements.

FIGS. 1A and 1B are diagrams illustrating a configuration example of a pyroelectric sensor device using a thermoelectric conversion element.

DESCRIPTION OF EXEMPLARY EMBODIMENTS

Figure 2:
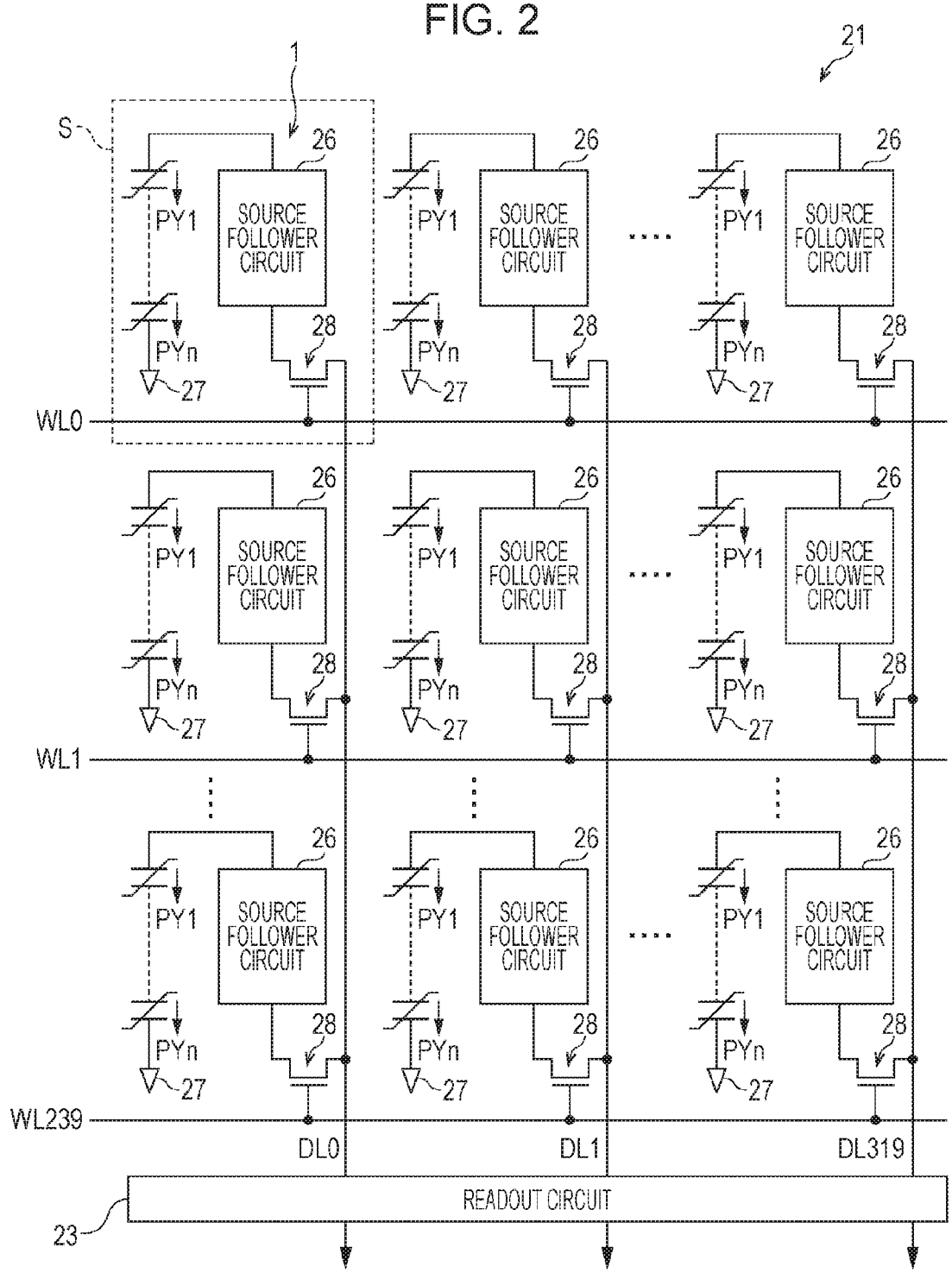
FIG. 2 is a diagram illustrating a configuration example of the pyroelectric sensor device by using the thermoelectric conversion element.

Hereinafter, embodiments of the invention will be described in detail with reference to the drawings. Note that, the following description is merely an aspect of the invention, and thus any modification thereof can be performed in the scope of the invention. In each drawing, the same constituting members are denoted by the same reference numerals, and the description thereof will be omitted. In addition, in each drawing, X, Y, and Z indicate three spatial axes which are orthogonal to each other. In the present specification, directions along the three spatial axes are respectively described as an X direction, a Y direction, and a Z direction. The Z direction indicates a thickness direction or a stacking direction of a substrate, a layer, and a film. The X direction and the Y direction indicate in-plane directions of the substrate, the layer, and the film.

Embodiment 1

FIGS. 1A and 1B, and FIG. 2 are diagrams illustrating a configuration example of a pyroelectric sensor device 20.

As illustrated in FIGS. 1A and 1B, the pyroelectric sensor device 20 is provided with a sensor array 21, a line selection circuit (a line driver) 22, and a readout circuit 23. In addition, the pyroelectric sensor device 20 includes an A/D conversion unit 24 and a control circuit 25. It is possible to realize an infrared camera which is used in, for example, a night vision device by using such a pyroelectric sensor device 20.

The sensor array 21 includes a plurality of row lines (word line, scanning line) WL0 to WL239, and a plurality of column lines (data line) DL0 to DL319.

Pyroelectric sensors (described below) are arranged (formed) in an area which is partitioned in a matrix shape by the aforementioned row lines WL0 to WL239 and the column lines DL0 to DL319. It is possible to consider that the sensor array 21 is formed by arranging a plurality of sensor cells S, each of which is formed of one row line WL and one column line DL, and a pyroelectric sensor which is connected to the row line WL and the column line DL, in a matrix.

The line selection circuit 22 is connected to one or a plurality of row lines. Then, a selecting operation for each row line is performed. For example, in a case of the sensor array 21 of QVGA (320×240 pixels) as illustrated in FIG. 1B, an operation of sequentially selecting (scanning) the row lines WL0, WL1, WL2 ... WL239 is performed. That is, a signal (word selecting signal) for selecting the aforementioned row lines is output to the sensor array 21.

The readout circuit 23 is connected to the plurality of column lines. Then a readout operation is performed for each column line. In a case of the sensor array of QVGA (320×240 pixels), an operation of reading out a detecting signal from the column lines DL0, DL1, DL2, . . . , and DL319 is performed. For example, although not shown, the readout circuit 23 is provided with each amplifier circuit corresponding to each of the plurality of column lines. In addition, each of the amplifier circuits amplifies signals of corresponding column lines.

The A/D conversion unit 24 performs A/D conversion a detecting voltage obtained in the readout circuit 23 into digital data. Then, digital data DOUT obtained by the A/D conversion is output. Specifically, the A/D conversion unit 24 is provided with an A/D convertor which corresponds to each of the plurality of column lines. In addition, the A/D convertor performs A/D conversion of the detecting voltage obtained by the readout circuit 23 in the corresponding column line. Meanwhile, one A/D convertor is provided corresponding to the plurality of column lines, and the detecting voltages of the plurality of column lines may be A/D converted in time division by using the one A/D convertor. In addition, the signal of each column line may be directly input to each A/D convertor of the A/D conversion unit 24 without providing the amplifier circuit of the readout circuit 23.

The control circuit 25 generates various control signals and then outputs the control signals to the line selection circuit 22, the readout circuit 23, and the A/D conversion unit 24. For example, the control circuit 25 generates and outputs a signal for controlling timing for each circuit.

FIG. 2 illustrates a configuration example of the sensor array 21. Each of the sensor cell S forming the sensor array 21 includes one row line WL, one column line DL, a readout transistor 28, and a pyroelectric sensor 1. The pyroelectric sensor 1 includes a source follower circuit 26, and first to n-th (n is an integer of 2 or more) thermoelectric conversion elements PY1 to PYn which are provided in series between the source follower circuit 26 and a low-potential-side power supply node 27. The pyroelectric sensor 1 is connected to the row line WL and the column line DL via the readout transistor (FET) 28. A source of the readout transistor 28 is connected to an output node of the source follower circuit 26. A drain is connected to the column lines DL0, DL1, DL2, . . . , and DL319. Further, a gate is connected to the row lines WL0, WL1, WL2, . . . , and WL239.

The detecting signal from each pyroelectric sensor 1 is read as follows. For example, in a case where the row line WL0 is selected, a voltage is applied to the gate of the readout transistor 28 in which the gate is connected to the row line WL0, and a channel is formed between the source and the drain, and thereby the gate is turned on. In addition, one or the plurality of pyroelectric sensors 1 corresponding to the row line WL0 are electrically connected to each of the corresponding column lines DL (DL0 to DL319). In this case, the row lines WL (WL1 to WL239) other than the row line WL0 are non-selected.

In this way, the detecting signals from one or the plurality of pyroelectric sensors 1 corresponding to the row line WL0 are read for each column. Thereafter, other row lines WL (WL1 to WL239) are sequentially selected, and the detecting signal is read from each pyroelectric sensor 1 in the same way as described above.

In such a pyroelectric sensor device 20, it is preferable that polarization directions of the first to n-th thermoelectric conversion elements PY1 to PYn are set as the same direction. If the n-thermoelectric conversion elements in the same polarization direction are connected in series, it is possible to obtain the detecting signal having a voltage level which is n-times the detecting signal obtained from one thermoelectric conversion element. As a result, it is possible to increase the detection sensitivity of the pyroelectric sensor device 20, and thus, for example, it is possible to realize an infrared camera with high sensitivity.

Figure 3:
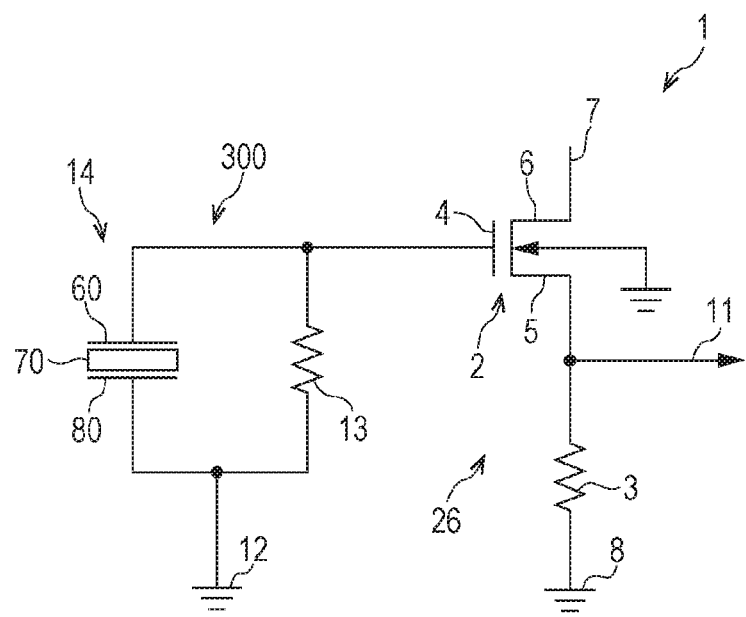
FIG. 3 is a diagram illustrating an example of a configuration of a circuit configuration of a pyroelectric sensor.

With reference to FIG. 3, a circuit configuration of the pyroelectric sensor 1 will be more specifically described. FIG. 3 is a diagram illustrating an example of the circuit configuration of the pyroelectric sensor 1. First, as for the description that the pyroelectric sensor 1 is provided with the plurality of thermoelectric conversion elements PY1 to PYn (refer to FIG. 2), for the sake of convenience of description, afterwards, the plurality of thermoelectric conversion elements PY1 to PYn are described as one thermoelectric conversion element 300. In a case where the plurality of thermoelectric conversion elements are provided in one pyroelectric sensor 1, a plurality of the thermoelectric conversion elements 300 may be connected in series.

The pyroelectric sensor 1 is provided with the source follower circuit 26 and the thermoelectric conversion element 300. The source follower circuit 26 includes a transistor 2 and a resistor 3. Structurally, the thermoelectric conversion element 300 is provided with a first electrode 60, a second electrode 80, and a pyroelectric film 70 interposed between the first electrode and the second electrode 80. The thermoelectric conversion element 300 includes a capacitor 14 and a component of a resistor 13 in a circuit.

The thermoelectric conversion element 300 is electrically connected to the transistor 2. Then, the transistor 2 outputs the detecting signal (pyroelectric current) based on the signal generated by the thermoelectric conversion element 300. As will be described below, the pyroelectric coefficient is contributed to the size of the pyroelectric current. Accordingly, it is possible to improve the sensitivity of the pyroelectric sensor 1 by increasing the pyroelectric coefficient.

The transistor 2 is a field effect transistor (FET). Specifically, the transistor 2 is an n-type FET of three terminals having a gate 4, a source 5, and a drain 6.

The gate 4 of the transistor 2 is connected to the first electrode 60 of the thermoelectric conversion element 300. The source 5 of the transistor 2 is connected to one end of the resistor 3. The drain 6 of the transistor 2 is connected to a high-potential-side power supply node 7. The other end of the resistor 3 is connected to a low-potential-side power supply node (ground) 8.

In addition, the second electrode 80 is connected to a ground 12. The second electrode 80 is also connected to one end of the resistor 13 in parallel with the ground 12. The other end of the resistor 13 is connected to between the gate 4 of the transistor 2 and the first electrode 60 of the thermoelectric conversion element 300.

In FIG. 3, the transistor 2 and the resistor 3 are provided in series between the high-potential-side power supply node 7 and the low-potential-side power supply node (ground) 8. That is, the source follower circuit 26 is formed of the transistor 2 and the resistor 3. In the source follower circuit 26, a predetermined impedance transformation is performed, and as a result, the voltage which is applied to the gate 4 is converted into the electric current. The output node 11 is connected to between the source 5 of the transistor 2 and the resistor 3. The electric current which is obtained by being converted by the source follower circuit 26 is output from the output node 11. The output node 11 is connected to a row line WL via the readout transistor 28 (refer to FIG. 2).

The thermoelectric conversion element 300 causes a temperature change by absorbing infrared thermal energy such that the surface charge is generated in response to the aforementioned temperature change. The generated charge flows into the gate 4 of the transistor 2, and thus the voltage is applied to the gate 4. When the voltage is applied to the gate 4, the channel is formed between the source 5 and the drain 6 in response to the size of the gate voltage, and the corresponding drain current flows in response to the channel. That is, the voltage which is applied to the gate 4 is converted into a pyroelectric current by the source follower circuit 26. The pyroelectric current is output from the output node 11 and then detected by a detecting device (not shown).

Figure 4A:
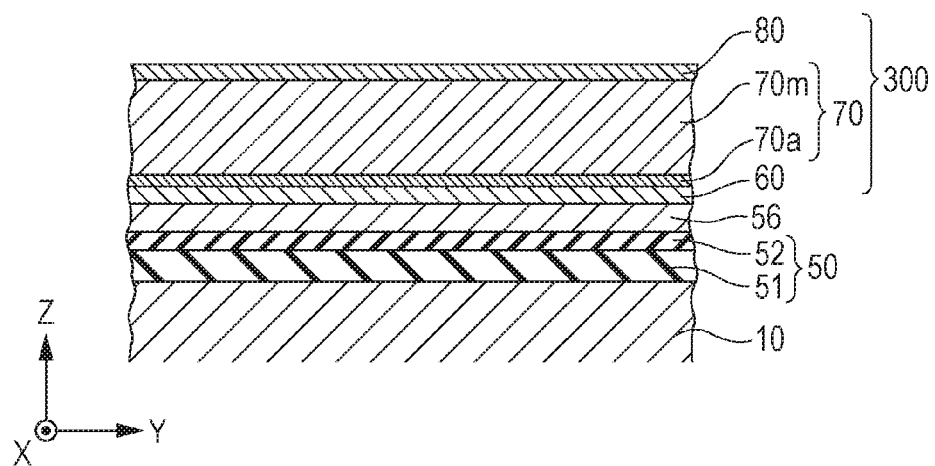
FIGS. 4A and 4B are sectional views illustrating a configuration example of the thermoelectric conversion element.
Figure 4B:
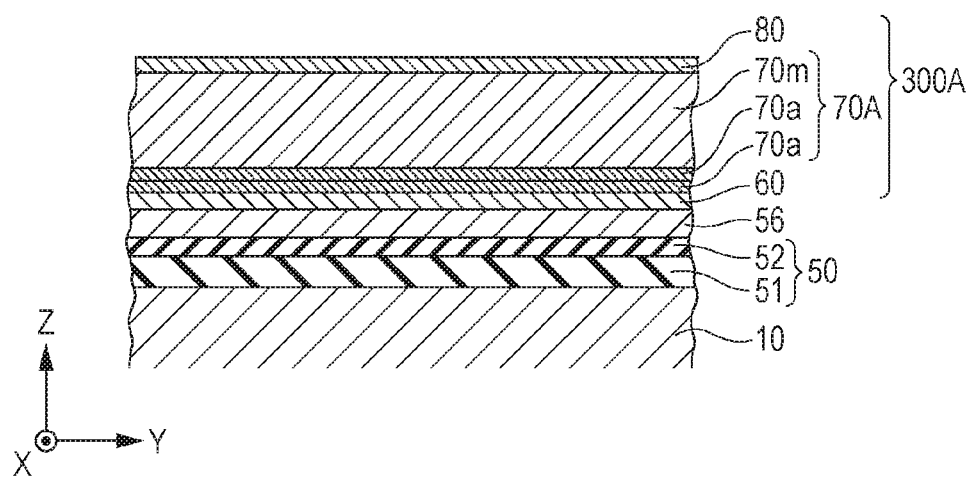

A specific configuration example of the thermoelectric conversion element 300 will be described. FIGS. 4A and 4B illustrate a sectional view obtained by cutting the thermoelectric conversion element 300 at a ZY plane which is parallel to a Z-axis and a Y-axis.

The thermoelectric conversion element 300 is provided on a substrate 10. The substrate 10 includes a surface parallel to an XY plane which is parallel to the X direction and the Y direction. The thermoelectric conversion element 300 is provided on the surface of the substrate 10. The substrate 10 is a Si single crystal substrate. The substrate may be formed of a SOI substrate, a glass substrate, or the like instead of the Si single crystal substrate.

A silicon dioxide ($SiO_2$) layer 51, a zirconium oxide ($ZrO_2$) layer 52, and an adhesive layer 56 are provided between the substrate 10 and the thermoelectric conversion element 300. The adhesive layer 56 can be formed of, for example, a titanium oxide ($TiO_x$) layer, a titanium (Ti) layer, or a silicon nitride (SiN) layer. The zirconium oxide layer 52 and the adhesive layer 56 may be omitted.

The thermoelectric conversion element 300 is provided with the first electrode 60, the pyroelectric film 70 provided on the first electrode 60, and the second electrode 80 provided on the pyroelectric film 70. The first electrode 60 and the second electrode 80 are electrically connected to a driving circuit (not shown). The surface charge generated on the pyroelectric film 70 is detected in the driving circuit through the first electrode 60 and the second electrode 80.

A material for the first electrode 60 or the second electrode 80 may be a conductive material. Examples of the material for the first electrode 60 or the second electrode 80 include a metal material, a tin oxide-based conductive material, a zinc oxide-based conductive material, and an oxide conductive material. Examples of the metal material include platinum (Pt), iridium (Ir), gold (Au), aluminum (Al), copper (Cu), titanium (Ti), and stainless steel. Examples of the tin oxide-based conductive material include indium tin oxide (ITO), a fluorine-doped tin oxide (FTC)), and the like. Examples of the oxide conductive material include the zinc oxide-based conductive material, a strontium ruthenium oxide ($SrRuO_3$), lanthanum nickelate ($LaNiO_3$), and element-doped strontium titanate. The material for the first electrode 60 or the second electrode 80 is not limited to the aforementioned materials. The material for the first electrode 60 or the second electrode 80 may be a conductive polymer or the like.

The pyroelectric film 70 is formed of a composite oxide having an $ABO_3$-type perovskite structure, and generates surface charge due to the change of the temperature. The pyroelectric film 70 is provided with a base layer 70a and a main layer 70m.

The pyroelectric film 70 is a ferroelectric substance having a thin film which is preferably in a range of 50 nm to 600 nm, and is more preferably in a range of 150 nm to 400 nm. If the thickness of the pyroelectric film 70 is smaller than the aforementioned range, it is less likely to obtain excellent pyroelectric properties. If the thickness of the pyroelectric film is greater than the aforementioned range, the capacity becomes larger, which may cause adverse effects on the sensitivity and response speed of the pyroelectric sensor.

Both of the base layer 70a and the main layer 70m are formed of the composite oxide having the $ABO_3$-type perovskite structure.

The composite oxide forming the main layer 70m includes at least Pb, Nb, and Ti, and is formed of tetragonal crystal which is oriented in the direction of {100} on the substrate 10. For example, the main layer 70m is formed of the composite oxide containing tetragonal ceramic in which $PbNbO_3$ which is pseudo-cubic crystal, and $PbTiO_3$ which is tetragonal crystal are dissolved. A composition of the aforementioned composite oxide is expressed by the following Formula (2), for example.

$$xPbNbO_3\text{-}(1-x)PbTiO_3 \qquad (2)$$

The composite oxide which is expressed by Formula (2) has the $ABO_3$-type perovskite structure. In the $ABO_3$-type perovskite structure, that is, in an $ABO_3$-type structure, an A site is coordinated with 12 oxygen atoms, and a B site is coordinated with six oxygen atoms, which form an octahedron. In Formula (2), Pb is positioned in the A site, and Nb and Ti are positioned in the B site.

The composite oxide forming the main layer 70m is not limited to the composition of Formula (2). The composite oxide which forms the main layer 70m may have a composition expressed by Formula (3). In Formula (3), M' is metal capable of obtaining Mg, Mn, Fe, Ni, Co, Zn, or the like which has a valence number of +2.

$$xPb(M'_{1/3},Nb_{2/3})O_3\text{-}(1-x)PbTiO_3 \qquad (3)$$

In Formula (3), in a case where M' is Mg, the composition of the composite oxide which forms the main layer 70m is expressed by Formula (4). Formula (4) expresses the composition of the composite oxide containing the tetragonal ceramic in which the lead magnesium niobate (Pb(Mg,Nb)$O_3$; PMN) and the lead titanate ($PbTiO_3$; PT) are dissolved.

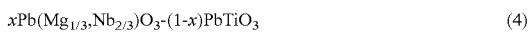

$$xPb(Mg_{1/3},Nb_{2/3})O_3\text{-}(1-x)PbTiO_3 \qquad (4)$$

Further, the composite oxide which forms the main layer 70m may include a composition expressed by Formula (5). The composition expressed by Formula (5) is a composition in which lead is excessively present in comparison with the stoichiometric ratio in the $ABO_3$ structure. In Formula (5), M' is the same as M' in Formula (3), and is, for example, Mg.

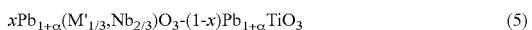

$$xPb_{1+\alpha}(M'_{1/3},Nb_{2/3})O_3\text{-}(1-x)Pb_{1+\alpha}TiO_3 \qquad (5)$$

(0.20≤x≤0.60 is preferable, and 0.30≤x≤0.45 is more preferable)

The description in the aforementioned Formulae is for the composition based on based on the stoichiometry, and as long as the perovskite structure can be obtained, not only deviation of the inevitable composition due to lattice mismatching and partial loss of the elements, but also partial substitution of the elements is acceptable. For example, when the stoichiometric ratio is set to be 1, it is acceptable to be in a range of the 0.85 to 1.20. In the Formulae (2) to (5), Ti may be partially substituted with M". M" is a metal capable of obtaining Zr, or the like which has a valence number of +4. The aforementioned M' or M" is not limited one type of metal, but may be a plurality of types of metal.

Figure 5A:
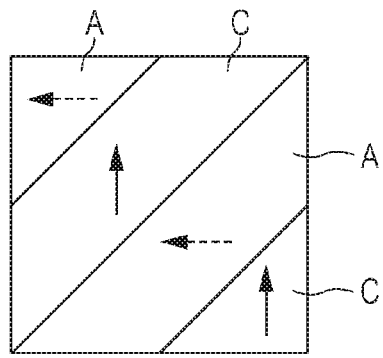
FIGS. 5A and 5B are diagrams illustrating a domain.
Figure 5B:
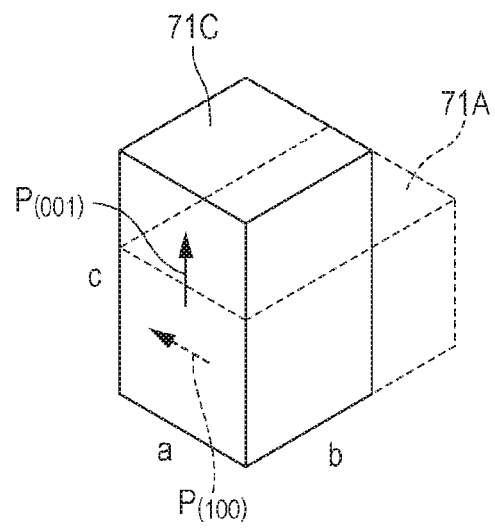

FIGS. 5A and 5B are diagrams illustrating a domain which is formed in the main layer 70m. The aforementioned pyroelectric material which forms the main layer 70m is a tetragonal crystal. Typically, the pyroelectric film which is formed of the tetragonal crystal relieves internal stress caused by a length ratio of the c-axis to the a-axis (c/a), and thus two types of ferroelectric domains are formed, as illustrated in FIG. 5A. That is, two types of the ferroelectric domains (A domain and C domain) illustrated in FIG. 5A are formed on the main layer 70m. The aforementioned pyroelectric material which forms the main layer 70m, that is, the composite oxide which contains Pb, Nb, and Ti, and has the perovskite structure formed of the tetragonal crystal which is oriented in the direction of {100} on the substrate 10 forms a nano-sized domain (so called nano-domain). The nano-domain is a domain formed of a unit lattice having a crystallite diameter D which is 20 nm, and is preferably equal to or less than 15 nm. A ferroelectric material forming the nano-sized domain has excellent properties (ferroelectricity, piezoelectricity, pyroelectricity, and the like). Accordingly, the pyroelectric coefficient of the pyroelectric film 70 is improved by employing such material as the main layer 70m, and thereby it is possible to improve the sensitivity of the thermoelectric conversion element 300.

In a case where the size of the C domain is assumed by a crystallite diameter $D_{(002)}$ of a c-axis component, and the size of the A domain is assumed by the crystallite diameter $D_{(200)}$ of the a-axis component, it is not necessary that both $D_{(002)}$ and $D_{(200)}$ are 20 nm, or preferably equal to or less than 15 nm. Since the polarization of the C domain is contributed to the pyroelectric effect, the crystallite diameter $D_{(002)}$ of the c-axis component may be equal to or less than 20 nm, or preferably equal to or less than 15 nm.

The polarization directions of the A domain and the C domain are different from each other by 90°. The A domain is an assembly of unit lattices 71A (in FIG. 5B, indicated by dotted line) having polarization $P_{(100)}$ in the direction of the orientation (100). The C domain is an assembly of unit lattices 71C (in FIG. 5B, indicated by dotted line) having polarization $P_{(001)}$ in the direction of the orientation (001) in parallel with the Z direction. As illustrated in FIG. 5A, the A domain having the polarization $P_{(100)}$ and the C domain having the polarization $P_{(001)}$ are mixed in the main layer 70m. In this way, a state where the domains having different polarization directions from each other by 90° are mixed is referred to as "90° domain".

There is a pyroelectric material which forms the domain having a relatively large size, that is, a domain having a size in a range of 50 nm to 10 μm. A representative example of such a pyroelectric material is PZT. In such a pyroelectric material, the properties become greatly enhanced in the vicinity of a morphotropic phase boundary in which a crystal structure varies, and thus there are many cases where the pyroelectric material is prepared at a composition ratio by using the properties. In addition, the PZT in such a composition ratio is typically rhombohedral crystal, and has domains at 71° and 109° (that is, domain at 90° is not formed). On the other hand, in the pyroelectric material which forms the nano-domain, particularly, it is possible to obtain properties surpassing the aforementioned PZT in the range outside of the aforementioned composition ratio. This will be confirmed in Examples described below.

The functions of the base layer 70a will be described. The base layer 70a has the lattice matching of less than 1% with the c-axis of the composite oxide which forms the main layer 70m. In addition, the base layer 70a has the lattice mismatching of equal to or greater than 1% with the a-axis and the b-axis with the composite oxide which forms the main layer 70m. According to this, it is easy to control the orientation of the pyroelectric material which forms the main layer 70m, and it is possible to realize the stability of the c-axis component of the pyroelectric material which is tetragonal crystal.

In addition, the relative permittivity of the PZT which forms the base layer 70a is greater than the relative permittivity of the pyroelectric material which forms the main layer 70m. That is, the relative permittivity of the main layer 70m is smaller than the relative permittivity of the base layer 70a. With this, an electrostatic capacitance of the thermoelectric conversion element 300 can be decreased more than the thermoelectric conversion element in which the entire pyroelectric film is formed of the PZT.

The lattice mismatching ratio of the c-axis component of the composite oxide forming the main layer 70m which is the tetragonal crystal to the PZT of the base layer 70a is preferably equal to or less than 0.1%. In addition, the lattice mismatching ratio of the a-axis component and the b-axis component of the composite oxide to the PZT of the base layer 70a is preferably equal to or greater than 1.5%. With this, it is advantageous for the improvement of the pyroelectric coefficient of the pyroelectric film 70.

Note that, it is possible to omit the base layer 70a, and as illustrated in FIG. 4B, it is possible to provide two or more base layers 70a, 70a, and the like. In a case where two or more base layers are provided, the material of each base layer may be the same as each other, or may be different from each other.

The thickness and the number of layers of the base layer 70a can be appropriately determined in consideration of the thickness and properties which are required in the pyroelectric film 70 or the main layer 70m. Needless to say, the entire thickness of the base layer 70a is much smaller than the main layer 70m.

Figure 6:
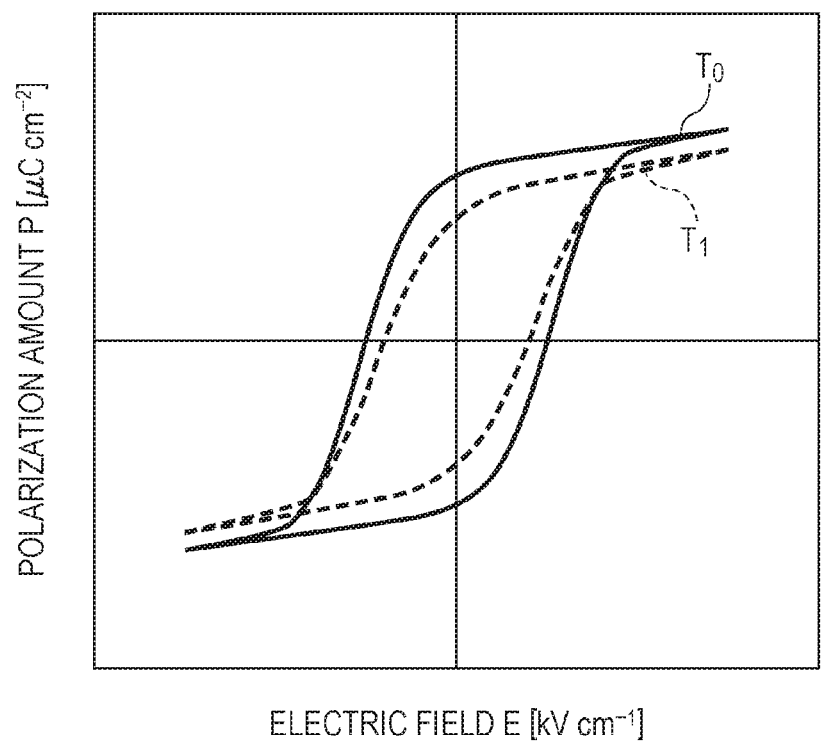
FIG. 6 is a diagram illustrating a P-E curve in a typical ferroelectric capacitor.

A relationship between the pyroelectric coefficient and the sensitivity of the pyroelectric sensor 1 will be described below. FIG. 6 is P-E hysteresis of the typical ferroelectric capacitor (an element obtained by interposing the ferroelectric substance between two electrodes) in a relationship between temperature $T_0$ and temperature $T_1$ ($T_1 > T_0$). In FIG. 6, a polarization amount P indicates a vertical axis and an electrical field E indicates a horizontal axis. A solid line corresponds to the temperature $T_0$, and a dashed line corresponds to the temperature $T_1$.

As is apparent from the comparison between the solid line and the dashed line in FIG. 6, in the typical ferroelectric substance, the spontaneous polarization amount P is decreased in accordance with an increase in the temperature. The phenomenon is reversible, and the spontaneous polarization amount P is increased in accordance with a decrease in the temperature. Since the ferroelectric substance essentially has the pyroelectric properties, the spontaneous polarization amount P is decreased in accordance with the increase in the temperature in the thermoelectric conversion element 300 as well.

In a case where the polarization amount in the temperature $T_0$ is set as $P_0$, the polarization amount in the temperature $T_1$ ($T_1 > T_0$) is set as $P_1$, and a difference between the temperature $T_1$ and the temperature $T_0$ is set as $T_1 - T_0 = \Delta T$, when the temperature is increased by time t from the temperature $T_0$ to the temperature $T_1$, the polarization amount is changed by $P_1 - P_0 = \Delta P$. In this case, the surface charge is changed by $\Delta Q = \Delta P \times A$ in the thermoelectric conversion element 300. This change of the surface charge is detected as the pyroelectric current of $I = \Delta Q/t$ between the thermoelectric conversion element and the transistor. The amount $\Delta Q$ of changing the charge is proportional to temperature difference $\Delta T$ in a wide temperature range. For this reason, the pyroelectric current I can be rewritten by I=(ΔQ/ΔT)×(ΔT/t), and thus the pyroelectric coefficient p is indicated by (ΔQ/ΔT).

If the change of charge ΔQ is generated due to the temperature difference ΔT, the relationship of C=Q/V is satisfied, and thus it is possible to consider that the potential difference ΔV is generated. In FIG. 3, the thermoelectric conversion element 300 is connected to the gate 4 of the transistor 2. For this reason, in a case of FIG. 3, the channel is formed between the source 5 and the drain 6 by the potential difference ΔV which is generated due to the temperature difference ΔT, and the drain current flows. This drain current is correlated with the gate voltage, that is, the potential difference ΔV. Therefore, it is possible to detect the temperature difference ΔT by detecting the drain current.

The electrostatic capacitance is defined by C=εA/d, and thus the potential difference ΔV which is generated due to the increase in the temperature is expressed by the following Formula (6).

$$\Delta V = \Delta Q/C = p \times \Delta T \times di/(\epsilon \times A) \quad (6)$$

(In Formula (6), ε indicates the relative permittivity, di indicates distance between electrodes, and A indicates area of electrode)

The potential difference ΔV is related to the sensitivity of the pyroelectric sensor. As the potential difference ΔV which is generated due to the reception of infrared radiation becomes larger, the sensitivity of the pyroelectric sensor becomes higher. As is apparent from the formula (6), in order to make the potential difference ΔV which is generated due to the reception of the infrared radiation large, it is preferable to make the pyroelectric coefficient p large.

As described above, in the embodiment, the pyroelectric material which forms the nano-domain is employed as the main layer 70m of the pyroelectric film 70, and thus it is possible to efficiently improve the pyroelectric coefficient. Accordingly, the potential difference ΔV which is generated due to the increase in the temperature is large, and it is possible to obtain the thermoelectric conversion element 300 with high sensitivity and the pyroelectric sensor 1.

In addition, as described above, in the embodiment, the pyroelectric film 70 is a ferroelectric substance having a thin film which is preferably in a range of 50 nm to 600 nm, more preferably in a range of 150 nm to 400 nm. Since the thermoelectric conversion element which uses the ferroelectric substance having a thin film has a small heat capacitor of the element, the light is very efficiently converted into the heat. Accordingly, it is possible to improve the sensitivity of the element by using the ferroelectric substance having a thin film. In addition, small heat capacitance means that the temperature of the element is rapidly increased. Accordingly, it is possible to improve the response of the device.

Meanwhile, as compared with the thermoelectric conversion element using a ferroelectric substance in which the distance di between electrodes is small, and thus the thickness is large, in the thermoelectric conversion element which uses the ferroelectric substance having a thin film, the electrostatic capacitance C becomes larger, which is a problem. From the Formula (6), the electrostatic capacitance C and the potential difference ΔV are in inverse proportion to each other, and the increase in the electrostatic capacitance C causes the decrease in ΔV, that is, the deterioration of the sensitivity. However, as described above, in the thermoelectric conversion element 300 of the embodiment, the relative permittivity of the main layer 70m is smaller than the relative permittivity of the base layer 70a. Accordingly, it is possible to relieve the effect on the increase in the electrostatic capacitance C of the thermoelectric conversion element 300 due to the thin film thickness, with small relative permittivity. Therefore, according to the embodiment, despite using the ferroelectric substance having a thin film, it is possible to maintain relatively large potential difference ΔV, and thus it is possible to obtain the thermoelectric conversion element 300 with high sensitivity and the pyroelectric sensor 1.

An example of a method of manufacturing the thermoelectric conversion element 300 as described above will be described. FIGS. 7A to 7D are sectional views illustrating a method of manufacturing the thermoelectric conversion element 300. As described above, it is possible to omit the adhesive layer in the invention, and thus in FIGS. 7A to 7D, it is possible to omit the illustrating of the adhesive layer 56.

First, a substrate wafer 110 which is a silicon wafer is prepared. Then, a silicon dioxide layer 51 is formed on the silicon wafer 110 by performing the thermal oxidation on the surface of the silicon wafer 110. In addition, a zirconium film is formed on the silicon dioxide layer 51 by using a sputtering method, and then is subjected to the thermal oxidation so as to obtain a zirconium oxide layer 52. Subsequently, the adhesive layer (not shown) which is formed of titanium oxide is formed on the zirconium oxide layer 52. It is possible to form the adhesive layer by performing the thermal oxidation on titanium obtained by using the sputtering method.

Figure 7A:
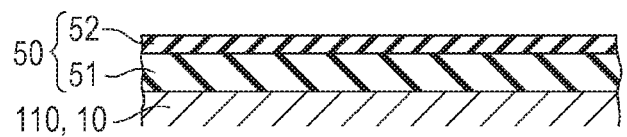
FIGS. 7A to 7D are diagrams illustrating a structure example of the thermoelectric conversion element.
Figure 7B:
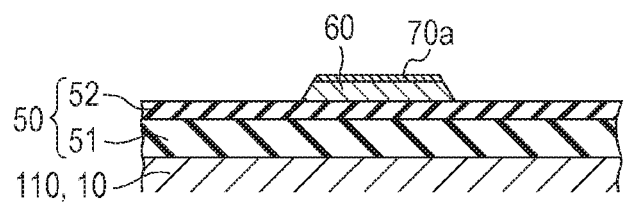

Next, the first electrode 60 and the base layer 70a are sequentially formed on the adhesive layer, and then the adhesive layer and the first electrode 60 and the base layer 70a are patterned at the same time so as to realize the shape illustrated in FIG. 7B. The first electrode 60 can be formed by using, for example, a vapor deposition such as a sputtering method, a vacuum deposition method, and a laser ablation method, and a liquid phase deposition such as a spin coating method.

The base layer 70a can be formed by using, for example, a liquid phase method such as a metal-organic decomposition method (MOD) and a sol-gel method. In addition, the base layer 70a can be also formed by using a solid phase method such as the laser ablation method, the sputtering method, a pulse laser deposition method (PLD method), a CVD method, and an aerosol deposition method. It is also possible to omit the base layer 70a.

The patterning can be performed by using, for example, a dry etching such as a reactive ion etching (RIE) and ion milling, or a wet etching by using an etching liquid. If necessary, only the adhesive layer and the first electrode 60 are patterned and then, the base layer 70a may be formed. In addition, the base layer 70a may be patterned together with the main layer 70m described below without being patterned in the current stage.

Figure 7C:
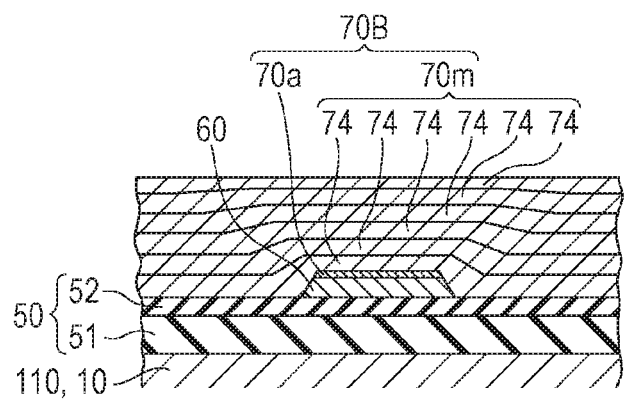
Figure 7D:
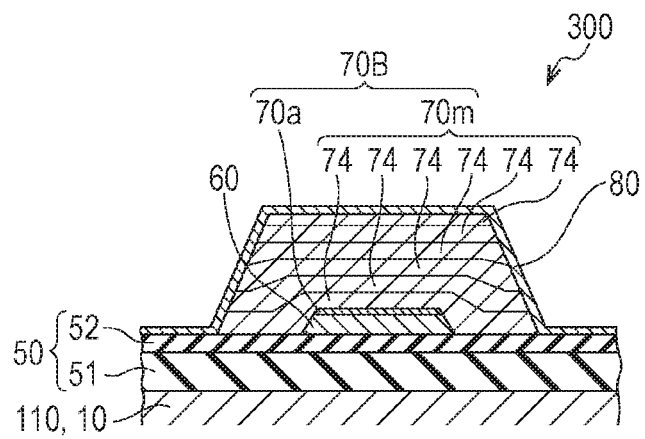

Next, as illustrated in FIG. 7C, the main layer 70m is formed. Similar to the base layer 70a, the main layer 70m can be formed by using various methods including a liquid phase method and a solid phase method. FIGS. 7C and 7D illustrate an example of the main layer 70m which is formed by using the liquid phase method. As illustrated in FIGS. 7C and 7D, the main layer 70m which is formed by using a wet method includes a plurality of ferroelectric films 74 obtained by a series of steps from a coating step to a baking step. That is, the main layer 70m is formed by repeatedly performing a series of steps from the coating step to the baking step.

Specific procedure of the case where the main layer 70m is formed by using the liquid phase method is as follows. First, a precursor solution is prepared so as to form the main layer 70m. The precursor solution is formed of a MOD solution or sol which contains a metal complex. In addition, a precursor film is formed in such a manner that the silicon wafer 110 on which a silicon dioxide layer 51, zirconium oxide layer 52, the adhesive layer 56, and the first electrode 60 are formed is coated with the precursor solution by using the spin coating method and the like (a coating step). Next, the obtained precursor film is heated at a predetermined temperature, for example, in a range of 130° C. to 250° C. and is dried for a predetermined time (a drying step). Subsequently, the dried precursor film is heated at a predetermined temperature, for example, in a range of 300° C. to 450° C., and then is degreased by maintained at the above temperature for a predetermined time (a degreasing step). Lastly, the degreased precursor film is heated at higher temperature, for example, in a range of 650° C. to 800° C., and then is crystalized by being maintained at the above temperature for a predetermined time (a baking step), and thereby the ferroelectric film 74 (for one layer) is completely formed. The main layer 70m which is formed of the plurality of ferroelectric films 74 is formed by repeatedly performing the above-described steps for the necessary number of layers. FIG. 7C illustrates the main layer 70m which is formed of six layers of ferroelectric films 74; however, the number of layers of the main layer 70m is not limited to the six.

The precursor solution for the main layer 70m is obtained by mixing a metal complex capable of forming the composite oxide containing at least Pb, Nb, and Ti through the baking step, and dissolving or dispersing the mixture into an organic solvent. Examples of the metal complex containing Pb include lead acetate and the like. Examples of the metal complex containing Nb include niobium penta-n-butoxide, and the like. Examples of the metal complex containing Ti include, for example, titanium tetra-i-propoxide, and the like. Similar to complex compounds expressed in the above-described Formulae (3) to (5), in a case of forming the composite oxide further containing metal M', Mg, or metal M" other than Pb, Nb, and Ti, the metal complex which further contains the aforementioned metal may be mixed into the precursor solution. As an example, example of the metal complex containing Mg includes magnesium acetate and the like.

In addition, in a case where the base layer 70a is formed by using the liquid phase method, a series of steps from the coating step to the aforementioned basking step may be repeatedly performed for the necessary number of layers by using metal complex capable of forming the composite oxide containing Pb, Zr, and Ti through the baking step.

Next, the main layer 70m which is formed of the plurality of ferroelectric films 74 is patterned so as to realize the shape illustrated in FIG. 7D. The patterning can be performed through the dry etching such as so-called reactive ion etching and ion milling, or a wet etching by using an etching liquid. Thereafter, the second electrode 80 is formed on the pyroelectric film 70. The second electrode 80 can be formed in the same way as that of the first electrode 60. Through the above-described steps, the thermoelectric conversion element 300 which is provided with the first electrode 60, the pyroelectric film 70, and the second electrode 80 is completely formed. In other words, a part in which the first electrode 60, the pyroelectric film 70, and the second electrode 80 are overlapped with each other becomes the thermoelectric conversion element 300.

After forming the thermoelectric conversion element 300, an electric field formed of a vibration waveform of bipolar may be applied to between the first electrode 60 and the second electrode 80 (Wake-up process). The electric field is, for example, equal to or greater than 40 V, and is preferably equal to or greater than 45 V. The vibration waveform can be a triangle wave. With this, it is possible to increase the rate of (001) orientation components in the pyroelectric material. Such an effect becomes larger as the content ratio of lead titanate is high.

Figure 8A:
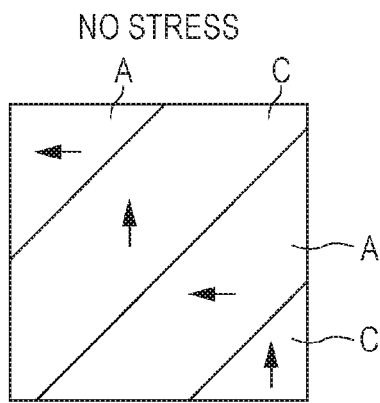
FIGS. 8A to 8C are diagrams illustrating an ideal state and a domain structure before and after processing Wake-up.

As described above, typically, the pyroelectric film which is formed of the tetragonal crystal relieve internal stress caused by a length ration of the c-axis to the a-axis (c/a), and thus the domain of 90° is formed as illustrated in FIG. 5A. In addition, as illustrated in FIG. 8A, the existence probability of C domain to A domain is 1:1 in an ideal state which is not affected by an external field.

Figure 8B:
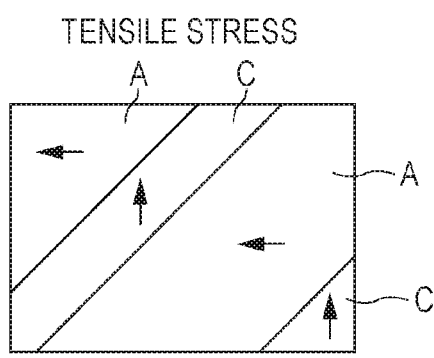

On the other hand, when the pyroelectric film 70, particularly, the main layer 70m is formed by using the above-described liquid phase method, shrinkage of the membrane volume due to the decomposition or elimination of the solvent and ligand from the precursor solution, or the difference of the coefficient of thermal expansion between the substrate 10 and the ferroelectric film 74, and thereby tensile stress is applied to the pyroelectric film 70. As a result, in comparison with a state where the stress is not applied, the pyroelectric film 70 is stretched to in-plane of the substrate 10. That is, the external field in which the A domain is easily formed is present in the embodiment. As a result, as illustrated in FIG. 8B, the ratio of A domain to the C domain is not 1:1, the rate of the A domain is higher than that of the C domain. In terms of the internal stress, as illustrated in FIG. 8A, the state in which the ratio of the A domain to the C domain is 1:1 is most stable. In contrast, in a case where the main layer 70m is formed by using the liquid phase method, the excessive A domains (semi-stable A domain having high energy in terms of the internal stress) is present in the pyroelectric film 70.

Figure 8C:
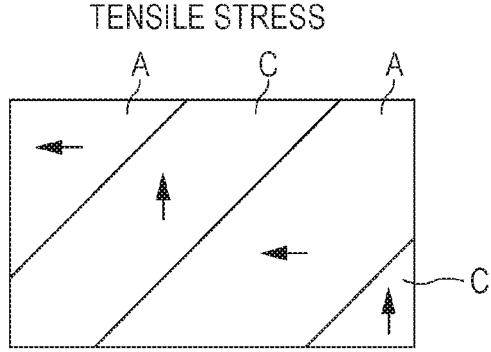

In this regards, when the Wake-up process is performed on the pyroelectric film 70 in the state as illustrated in FIG. 8B, the domains are rearranged, and thus the rate of C domain becomes higher than the case where the Wake-up process is not performed. In addition, the ratio of the A domain to the C domain is approximated to 1:1, and thus the pyroelectric film 70 becomes further stable in terms of the internal stress. Here, the effect of the tensile stress by the external field still exists after performing the Wake-up process. Accordingly, the ideal ration of 1:1 is not realized, and thus as illustrated in FIG. 8C, the rate of the A domain is still slightly higher than that of the C domain after performing the Wake-up process. Such a change can be confirmed based on, for example, peak intensity by X-ray. When the rate of C domain becomes higher by the Wake-up process, the c-axis component which is contributed to the pyroelectric effect is increased, and thus it is possible to obtain the thermoelectric conversion element with higher sensitivity. In addition, in a case where the main layer 70m is formed of materials expressed by the above-described Formulae (2) to (5), the ratio of c to a becomes larger in a composition region in which lead titanate on the right side of each Formula becomes more than the component on the left side thereof. The reason for this is that the component on the left side of each Formula is typically rhombohedral crystal, whereas lead titanate is the tetragonal crystal. Thus, in comparison with a case of a composition having a small amount of lead titanate, in a case of a composition having a large amount of lead titanate, the rate of existence of the C domain becomes larger after performing the Wake-up process.

EXAMPLES

Hereinafter, the invention will be more specifically described with reference to the examples. Note that, the invention is not intended to be limited to the following examples.

Evaluation Content 1

Examples 1 to 4

As Example 1, the thermoelectric conversion element 300 illustrated in FIG. 4A was formed as described below.

A precursor solution was formed in such a manner that an acetic acid and water were weighted, then lead acetate, zirconium butoxide, titanium tetra-i-propoxide, and polyethylene glycol were in a container, and these were stirred and heated at 90° C.

Then, a mixed solution was formed by weighting 2-butoxyethanol and dimethyl amino ethanol in the container. Titanium tetra-i-propoxide and niobium penta-n-butoxide were weighted in a glove box filled with dry nitrogen, and then mixed into the aforementioned mixed solution. Thereafter, the resultant was sufficiently stirred at room temperature, then each of magnesium acetate and lead acetate was weighted under the atmosphere, magnesium acetate and lead acetate were mixed and stirred at room temperature, and thereby a PMN-PT precursor solution was formed. Note that, titanium tetra-i-propoxide, niobium penta-n-butoxide, magnesium acetate, and lead acetate were prepared based on the composition expressed in Formula (5) such that the rates of x and α become as indicated in Table.

The silicon dioxide layer 51 was formed on the substrate by performing thermal oxidation on a 6-inch silicon substrate. Then, a zirconium film was formed by using the sputtering method, and the zirconium film was subjected to the thermal oxidation so as to form the zirconium oxide layer 52. The first electrode 60 was formed by sequentially forming titanium, platinum, iridium, and titanium on the zirconium oxide layer 52 by using the sputtering method.

Next, the first electrode 60 was coated with the aforementioned PZT precursor solution by using the spin coating method, then was dried at 140° C., and was degreased at 370° C. Thereafter, the base layer 70a formed of the PZT was formed by heating the coated first electrode 60 at 737° C. using a rapid thermal annealing (RTA) apparatus.

Then, the base layer 70a was coated with the above-described PMN-PT precursor solution by using the spin coating method, then was dried at 180° C., and was degreased at 350° C. Thereafter, the ferroelectric film 74 formed of the PMN-PT was formed by heating the coated base layer 70a at 750° C. using the RTA apparatus. By repeatedly performing the above-described steps six times, the main layer 70m formed of six layers of ferroelectric films 74 was formed on the base layer 70a.

Further, a platinum film was formed on the main layer 70m by using the sputtering method. Then, the second electrode 80 was formed by baking the electrode at 650° C. using the RTA apparatus. Through the above-described steps, the thermoelectric conversion element 300 provided with the first electrode 60, the pyroelectric film 70 (the base layer 70a and the main layer 70m), and the second electrode 80 was formed.

Example 5

As Example 5, a thermoelectric conversion element 300A illustrated in FIG. 4B was formed as described below.

In the same step as that in Example 1, the silicon dioxide layer 51, the zirconium oxide layer 52, the first electrode 60, and the base layer 70a (the first layer) were formed on the substrate. The titanium film was formed on the base layer 70a (the first layer) and the first electrode 60 by using the sputtering method, and a second base layer 70a formed of the PZT was formed in the same procedure as the procedure in which the first base layer 70a was formed on the aforementioned titanium film.

Subsequently, the PMN-PT precursor solution was prepared in the same procedure as that in Examples 1 to 4. Titanium tetra-i-propoxide, niobium penta-n-butoxide, magnesium acetate, and lead acetate were prepared based on the composition expressed in Formula (5) such that the rates of x and α become as indicated in Table.

The second base layer 70a is coated with the prepared PMN-PT precursor solution by using the spin coating method, and was dried at 180° C., and degreased at 350° C. Thereafter, the ferroelectric film 74 formed of the PMN-PT was formed by heating the coated base layer 70a at 750° C. using the RTA apparatus. By repeatedly performing the above-described steps nine times, the main layer 70m formed of nine layers of ferroelectric films 74 was formed on the base layer 70a.

Further, a platinum film was formed on the main layer 70m by using the sputtering method. Then, the second electrode 80 was formed by baking the electrode at 650° C. using the RTA apparatus. Through the above-described steps, the thermoelectric conversion element 300A provided with the first electrode 60, the pyroelectric film 70A (the second base layer 70a and the main layer 70m), and the second electrode 80 was formed.

Comparative Example 1

Except that the main layer is set as the PZT having the phase boundary composition, a thermoelectric conversion element 300A of Comparative Example 1 was formed in the same way as that in Example 5.

X-Ray Diffraction Measurement Using Two-Dimensional Detector

Regarding Examples 1 to 5, and Comparative Example 1, a two-dimensional mapping image and a diffraction pattern were measured by using "D8 DISCOVER" manufactured by Bruker AXS for the orientation of a crystal structure of the pyroelectric film, CuKα for a line source, and a two-dimensional detector (GADDS) for a detector. The range can be detected as the image is limited to a configuration of an apparatus, and thus is as follows; φ=±30° corresponding to 2θ=22.5° in which (100) peak is detected, φ=±32° corresponding to 2θ=32.5° in which (110) peak is detected, and φ=±26° corresponding to 2θ=40° in which (111) peak is detected.

Figure 9:
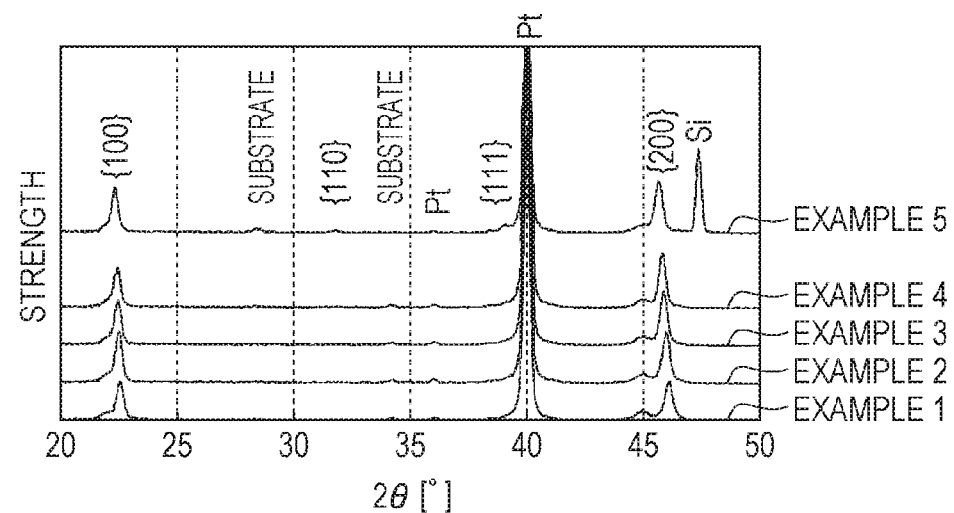
FIG. 9 is a diagram illustrating an X-ray diffraction pattern relating to the thermoelectric conversion element.

FIG. 9 illustrates the X-ray diffraction pattern which is measured before forming the second electrode 80 in Examples 1 to 5. In Examples 1 to 5, only the peak derived from the substrate and the peak caused by the $ABO_3$ structure were observed, and a different phase was not observed. Note that, in FIG. 9, the peak caused by Si was observed only in Example 5; however, the aforementioned peak is caused by a plane orientation of the used Si substrate, and it is confirmed that the properties are not affected by the peak. Comparative Example 1 had the same $ABO_3$ structure, and thus a different phase was not observed.

In addition, Examples 1 to 5 were oriented in the direction of {100}, and were clearly observed in a state where a diffraction pattern of a (001) plane ((002) plane) which is the c-axis in the vicinity of 2θ=45°, and a diffraction pattern of a (100) plane ((200 plane)) which is the a-axis and the b-axis in the vicinity of 2θ=46° were separated from each other. From this aspect, it was found that Examples 1 to 5 were the tetragonal crystal. In addition, since Comparative Example 1 is the phase boundary composition, the a-axis, the b-axis, and the c-axis were observed as a single peak from the appearance. For this reason, the identification of the crystal system was not realized. Thus, the analysis was performed as pseudo-cubic crystal.

Figure 10:
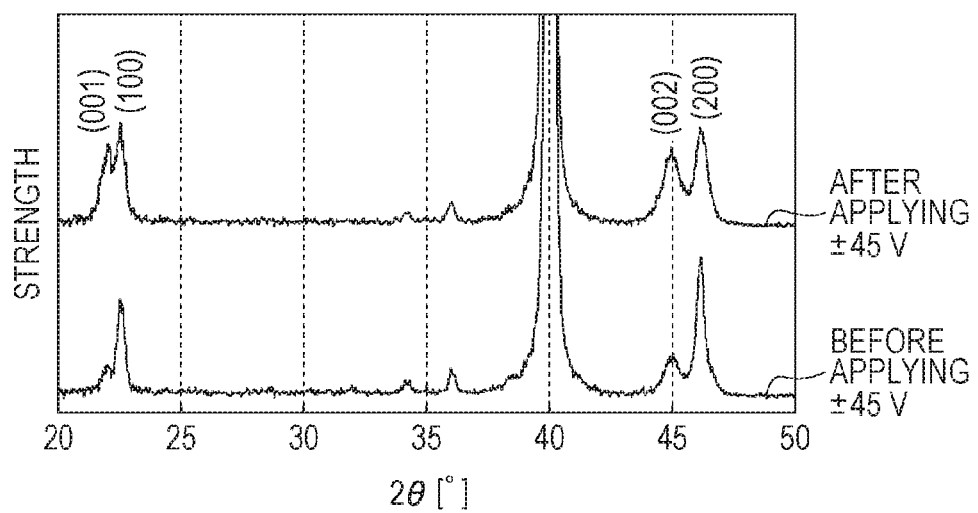
FIG. 10 is a diagram illustrating the X-ray diffraction pattern relating to the thermoelectric conversion element.

FIG. 10 is a diagram illustrating the X-ray diffraction pattern before and after the wake-up process in Example 1, that is, the X-ray diffraction pattern before and after applying AC±45 V. As illustrated in FIG. 10, it was apparent that peak strength of the (200) plane which corresponds to the A domain was decreased due to the wake-up process, and peak strength of the (002) plane which corresponds to the C domain was increased. The reason for this is that some of the A domains are rearranged due to the wake-up process so as to be the C domain, and then the state is maintained even after stopping the electric field application. From this aspect, it was found that due to the wake-up process, the ration of the A domain to the C domain was approximated to 1:1, and the c-axis component which contributes to the pyroelectric effect was increased.

Evaluation of Relative Permittivity

As for Examples 1 to 5 and Comparative Example 1, the electrostatic capacitance of the pyroelectric film was measured by using "4294A" manufactured by Hewlett-Packard Company. The measurement was performed under the following conditions: under atmosphere and room temperature (25° C.), DC=0 V, Amplitude=0.141 V, and Frequency=1 kHz.

The measurement results are indicated in Table. From the evaluation results, it was found that the pyroelectric film in Examples 1 to 5 had the relative permittivity which is lower than that of the pyroelectric film in Comparative Example.

Composition Dependence of Crystallite Diameter

It is well known that the crystallite diameter can be evaluated from a line broadening (full width at half maximum: FWHM) of the diffraction pattern of XRD. Scherrer equation is expressed by $D=K\lambda/B\cos\theta$. In Scherrer equation, D is denoted as a size of crystal, K is denoted as Scherrer's constant, λ is denoted as a X-ray wavelength (CuKα=1.5418 angstrom), B is denoted as a sample line broadening at FWHM after subtracting the instrumental line broadening, and θ is denoted as a Bragg angle (half of diffraction angle of 2θ).

In the specification, as for K, K=0.63661 defined based on a volume-weighted average thickness was used, and as for the instrumental line broadening, line broadening $B_{si}=0.19918$ obtained by measuring the silicon standard sample by using the XRD apparatus was used.

Figure 11A:
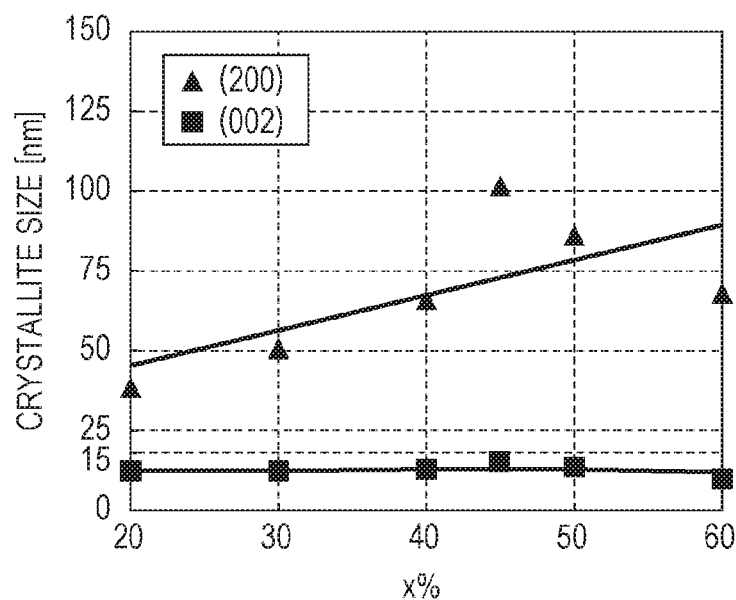
FIGS. 11A and 11B are diagrams illustrating composition dependence of a crystallite diameter relating to the thermoelectric conversion element.
Figure 11B:
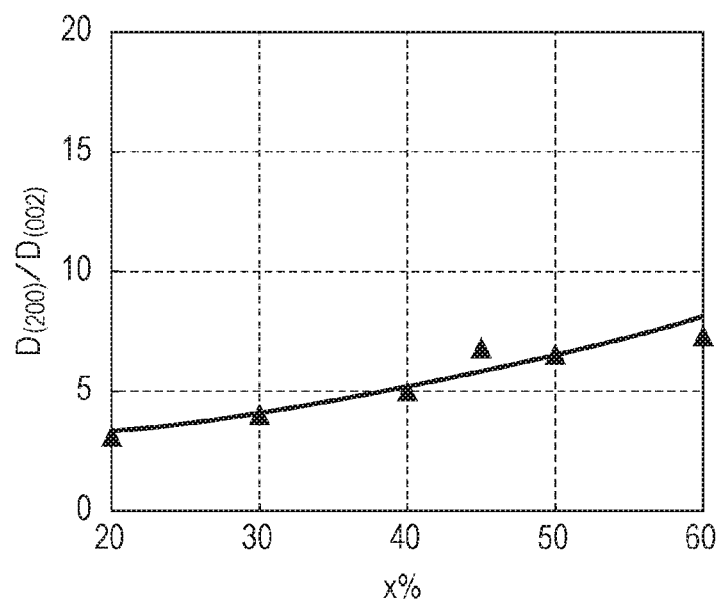

FIG. 11A illustrates composition dependence of the crystallite diameters of the (200) plane and the (002) plane obtained by the diffraction pattern based on the Scherrer equation, and FIG. 11B illustrates composition dependence of the ratio ($D_{(200)}/D_{(002)}$) of the crystallite diameter $D_{(200)}$ of the (200) plane to the crystallite diameter $D_{(002)}$ of the (002) plane based on the Scherrer equation. As illustrated in FIG. 11A, the crystallite diameter of the (002) plane in Examples 1 to 5 was smaller than the crystallite diameter of the (200) plane, and was equal to or less than 15 nm. On the other hand, as illustrated in FIG. 11B, the crystallite diameter of the (200) plane was 3 to 16 times crystallite diameter of the (002) plane.

Lattice Matching of Base Layer

It is well-known that the lattice matching with the base layer 70a is important in order to control the orientation in the main layer 70m of the pyroelectric film. The aforementioned Table indicates the lattice mismatching ratio of the (200) peak of PZT which is the base layer 70a to the (002) and (200) peaks of PMN-PT which are the main layer 70m. Note that, a d value based on 2d sin θ=nλ, which is a Bragg condition, was obtained and thus the lattice mismatching ratio was obtained as an absolute value of the difference of the obtained d value. The aforementioned Table also indicates the ratio (c/a) of the c-axis to the a-axis of the composite oxide which forms the main layer 70m.

As indicated in Table, the lattice mismatching ratio in the (002) component of PMN-PT is in a range of 0.01% to 0.03%, which is very satisfactory lattice matching ratio. On the other hand, the (200) component has the lattice mismatching ratio in a range of 1.15% to 2.31%. From this aspect, it was found that by causing the PZT which is the base layer 70a to serve as a control layer for controlling the orientation in the direction of {100}, it is possible to form PMN-PT having the (002) component which is excellent in the lattice matching ratio.

TABLE

| | Main layer (Orientation) | a | x | c/a | Relative permittivity | (002) Mismatching ratio (%) | (200) Mismatching ratio (%) |
|---|---|---|---|---|---|---|---|
| Example 1 | PMN-PT (100) | 1.14 | 0.2 | 1.026 | 598 | 0.01 | 2.31 |
| Example 2 | PMN-PT (100) | 1.14 | 0.3 | 1.022 | 742 | 0.01 | 2.07 |
| Example 3 | PMN-PT (100) | 1.14 | 0.4 | 1.018 | 1007 | 0.03 | 1.87 |
| Example 4 | PMN-PT (100) | 1.14 | 0.5 | 1.015 | 1369 | 0.03 | 1.74 |
| Example 5 | PMN-PT (100) | 1.14 | 0.4 | 1.021 | 812 | — | — |
| Comparative Example 1 | PZT (100) | 1.17 | — | — | 1627 | 0.02 | 1.15 |

Evaluation of Pyroelectric Coefficient

Regarding Example 3 and Comparative Example 1, the measurement was performed by using the electrode pattern of φ=500 nm with "TS-FET" manufactured by Rigaku Co., Ltd. The measurement of the pyroelectric current which is generated due to the temperature change of 5° C. per minute was performed after performing the polarization at −170° C. (measurement condition).

Figure 12:
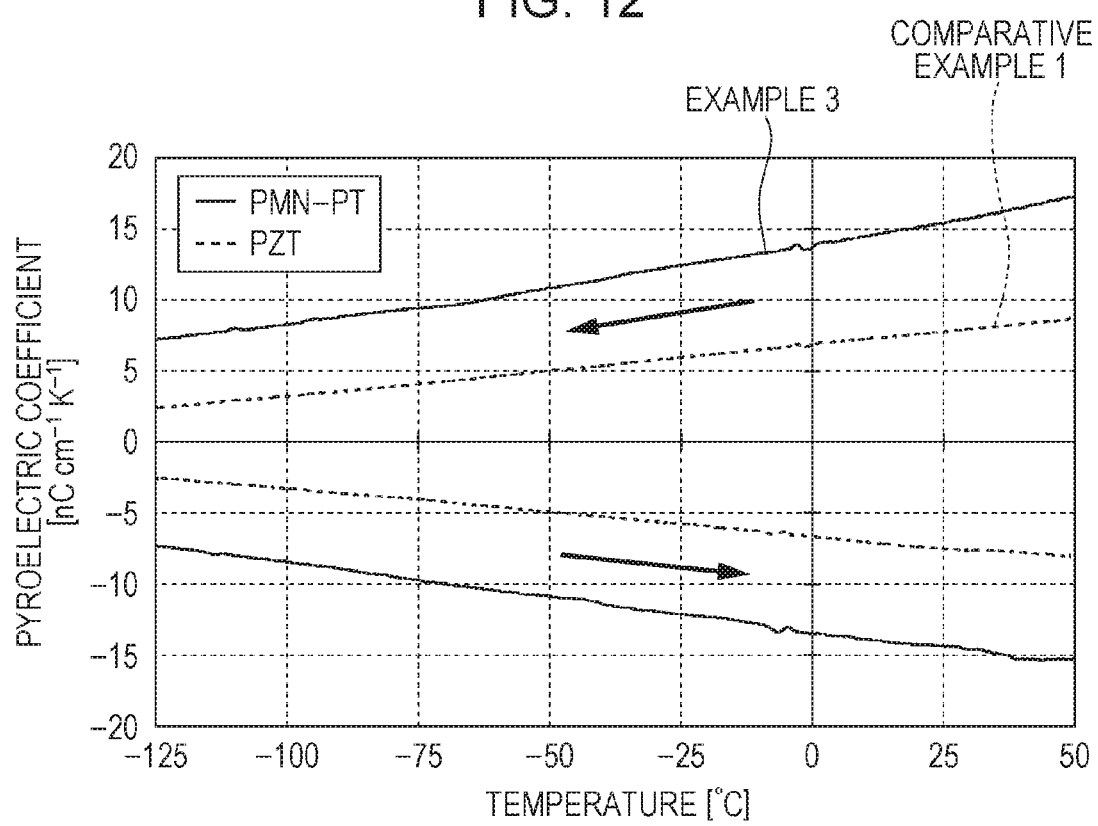
FIG. 12 is a diagram illustrating a relationship between a temperature and a pyroelectric coefficient relating to the thermoelectric conversion element.

The measurement result of the pyroelectric coefficient for each temperature is illustrated in FIG. 12. As illustrated in FIG. 12, regarding Example 3 and Comparative Example 1, symmetrical pyroelectric currents were detected at the increasing temperature and the decreasing temperature. As apparent from FIG. 12, the pyroelectric current at 25° C. was approximately 7.6 nCcm$^{-2}$K$^{-1}$ in Example 3, and was approximately 15.2 nCcm$^{-2}$K$^{-1}$ in Comparative Example 1. From this result, it was found that the pyroelectric film in Example 3 has the pyroelectric coefficient which is about twice the pyroelectric film in Comparative Example 1. It is estimated that the pyroelectric film in other examples has also the pyroelectric coefficient which is higher than the pyroelectric coefficient in Comparative Example 1.

OTHER EMBODIMENTS

As described above, one embodiment of the invention has been described; however, the basic configuration of the invention is not limited to the above-described matters.

For example, it is possible to various types of transistors as the transistor without being limited to the field effect transistor (FET). In addition, the circuit which is formed of various types of transistors may be an integrated circuit or other ground circuits without being limited as long as the circuit outputs an electrical charge generated in the first electrode (or the second electrode) as a voltage or a size of the voltage.

In addition, the thermoelectric conversion element of the embodiment describes excellent pyroelectric properties, and thus is preferably applicable to a device such as a pyroelectric temperature detector, a biological detector, and a heat-electricity convertor.

In the drawings, constituent components, that is, the thickness and width of the layer, and relative positional relationships have been shown exaggerated to facilitate description of the invention. In addition, the term of "on" in the present specification is not limited to "right on" in the positional relationship between the constituent components. For example, the expression of "the first electrode on the substrate" or "the pyroelectric film on the first electrode" includes that other constituent components are included between the substrate and the first electrode, or between the first electrode and the pyroelectric film.

The entire disclosure of Japanese Patent Application No. 2015-109077, filed May 28, 2015 is expressly incorporated by reference herein.

What is claimed is:

1. A thermoelectric conversion element comprising:
a first electrode provided on a substrate;
a pyroelectric film that is provided on the first electrode, is formed of a composite oxide having an ABO$_3$-type perovskite structure, and generates a surface charge due to temperature change; and
a second electrode provided on the pyroelectric film,
wherein the composite oxide which forms at least a portion of layer in the pyroelectric film contains at least Pb, Nb, and Ti, and is formed of tetragonal crystal which is oriented in the direction of {100} on the substrate,
the composite oxide which forms at least a portion of layer in the pyroelectric film has a composition expressed by the following Formula (1):

$$x\text{Pb}(\text{Mg},\text{Nb})\text{O}_3\text{-}(1\text{-}x)\text{PbTiO}_3 \qquad (1),$$

where
(0.20≤x≤0.60).

2. The thermoelectric conversion element according to claim 1,
wherein a crystallite diameter D$_{(002)}$ of a c-axis component which contributes to a pyroelectric effect of the crystal is equal to or less than 20 nm.

3. The thermoelectric conversion element according to claim 1,
wherein a ratio (D$_{(200)}$/D$_{(002)}$) of a crystallite diameter D$_{(200)}$ to the crystallite diameter D$_{(002)}$ in the crystal is greater than 3.

4. The thermoelectric conversion element according to claim 1,
wherein relative permittivity of a part which is formed of the composite oxide forming at least a portion of layer in the pyroelectric film is in a range of equal to or greater than 600 and less than 1400.

5. The thermoelectric conversion element according to claim 1,
wherein the pyroelectric film includes a main layer which is formed of the composite oxide forming at least a portion of layer in the pyroelectric film, and a base layer which is formed on the first electrode side of the main layer, and
wherein the lattice matching ratio of the base layer to the c-axis of the composite oxide forming the main layer is less than 1%, and the lattice matching ratio of the base layer to the a-axis and the b-axis of the composite oxide forming the main layer is equal to or greater than 1%.

6. The thermoelectric conversion element according to claim 5,
wherein the relative permittivity of the main layer is smaller than the relative permittivity of the base layer.

7. The thermoelectric conversion element according to claim 5,
wherein the base layer is formed from PZT.

8. A pyroelectric sensor including the thermoelectric conversion element according to claim 1.

9. A pyroelectric sensor including the thermoelectric conversion element according to claim 2.

10. A pyroelectric sensor including the thermoelectric conversion element according to claim 3.

11. A pyroelectric sensor including the thermoelectric conversion element according to claim 4.

12. A pyroelectric sensor including the thermoelectric conversion element according to claim 5.

13. A pyroelectric sensor including the thermoelectric conversion element according to claim 6.

14. A pyroelectric sensor including the thermoelectric conversion element according to claim 7.

15. The pyroelectric sensor according to claim 8,
wherein the thermoelectric conversion element is connected to a transistor, and thus the transistor outputs a detecting signal based on a surface charge generated in the thermoelectric conversion element.

16. The pyroelectric sensor according to claim 8, further comprising a field effect transistor, and at least one of the first electrode and the second electrode is connected to a gate of the field effect transistor.

* * * * *